(12) United States Patent
Yoon et al.

(10) Patent No.: US 6,334,012 B1
(45) Date of Patent: Dec. 25, 2001

(54) OPTICAL CONNECTOR MODULE

(75) Inventors: Eung-yeoul Yoon; Hyun-kuk Shin, both of Suwon; Il Kim, Yongin, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/414,940

(22) Filed: Oct. 8, 1999

(30) Foreign Application Priority Data

Oct. 8, 1998 (KR) .................................................. 98-42031

(51) Int. Cl.[7] ................. G02B 6/28; G02B 6/36
(52) U.S. Cl. ................. 385/24; 385/88; 385/89; 385/92
(58) Field of Search .................. 385/88, 89, 90, 385/91, 135, 92, 93, 53; 250/551; 354/135

(56) References Cited

U.S. PATENT DOCUMENTS

| | | | |
|---|---|---|---|
| 3,792,284 | * | 2/1974 | Kaelin .................................. 250/551 |
| 3,878,397 | * | 4/1975 | Robb et al. ......................... 250/551 |
| 4,595,839 | * | 6/1986 | Braun et al. ........................ 250/551 |
| 4,767,168 | * | 8/1988 | Grandy ................................... 385/53 |
| 4,916,689 | * | 4/1990 | Bielinski .............................. 359/135 |
| 5,239,605 | * | 8/1993 | Shimada ................................ 385/88 |
| 5,448,676 | * | 9/1995 | White et al. ........................... 385/88 |

* cited by examiner

*Primary Examiner*—Hemang Sanghavi
*Assistant Examiner*—Scott Knauss
(74) *Attorney, Agent, or Firm*—Sughrue Mion, PLLC

(57) ABSTRACT

Disclosed is an optical connector module for being connected between first and second devices for receiving and/or outputting electrical information signals, and being capable of converting input electrical signals to optical signals, transmitting the converted signals and again converting the transmitted optical information signals into electrical information signals. The optical connector module comprises: a first connector module for being connected to the first device while being electrically detachable and for converting the electrical signals from the first device into optical information signals; an optical fiber cable, one end of which is disposed to face the first connector module for transmitting the input optical information signal to the other end; and a second connector module for being connected to the second device while being electrically detachable and for converting the optical information signals transmitted through the optical fiber cable into electrical information signals and applying the converted signal to the second device.

12 Claims, 14 Drawing Sheets

OPTICAL CONNECTOR MODULE

BACKGROUND OF THE INVENTION

1. Field of the Invention

The present invention relates to an optical connector module incorporated between devices for transmitting optical signals from one device to another by optical transmission, and more particularly, to an optical connector module for electrically connecting light emitting devices and/or light receiving devices which are integrated with an optical transmitting portion.

2. Description of the Related Art

In general, an optical connector module is installed between devices for transmitting information signals from one device to another. For example, a module is installed between the motherboard of a computer and a bus, the motherboard of a computer and a monitor or buses, and permits information to be transmitted optically between the devices. To this end, the optical connector module is employed in a multi-channel optical transmission module, having an array structure so that each element of the optical connector module can transmit a light beam independently, and couples optical elements consisting of light emitting devices and/or light receiving devices to optical fibers in order to guide the light beams.

Referring to FIG. 1, a conventional optical connector module comprises: a first connector 3 incorporated with a device 1 so as to form a transmitting and/or receiving port; an optical element 5 installed in the first connector 3 for emitting a light beam or receiving incident light beams; a second connector 7 having a shape corresponding to the first connector 3 and joined to the first connector 3 in a plugged-in manner; and, an optical fiber cable 9 having one end installed at the second connector 7 for transmitting the incident light beams to the other device. Here, another optical connector (not shown) having a same or similar structure to the first and second connectors 3 and 7 is installed to be interconnected between the other end of the optical fiber cable 9 and the other device to be connected to the device 1.

The optical element 5 comprises light emitting devices and/or light receiving devices. Here, the light emitting devices convert electrical signals, input from a driving circuit formed on a circuit board (not shown) of the device 1, into optical signals, and the light receiving devices convert optical signals transmitted through the optical fiber cable 9 into electrical signals and transmit the converted signals to a controller (not shown) mounted on the circuit board.

One end of the optical fiber cable 9 is installed at the second connector 7 so that the end of the optical fiber cable 9 may face the optical element 5 when the first and second connectors 3 and 7 are assembled to each other, and the optical fiber cable 9 transmits the light beams input through the optical element 5 to the other device.

Since the optical connector module as described above is configured so that the devices can be connected or disconnected by connecting or disconnecting the first and second connectors 3 and 7 where the optical element 5 and the optical fiber cable 9 are installed, respectively, data errors, variation in optical power, etc., may result when the first and second connectors 3 and 7 are repeatedly connected and disconnected from each other. In addition, the reliability of moisture-proof and vibration-proof characteristics cannot be assured. Further, as connections and disconnections between the first and second connectors 3 and 7 are repeated, problems can occur in which optical alignment errors between the optical element 5 and the optical fiber cable 9 become larger.

In addition, there is a problem in that when the conventional optical connector module is applied to a device intended to transmit signals to another device through typical electrical connections, is the port structures of typical devices must be modified since the conventional optical connector module is incompatible with the typical devices.

SUMMARY OF THE INVENTION

To solve the above problems, it is an objective of the present invention to provide an optical connector module in which the connections between optical element portions and an optical fiber cable are hermetically sealed so that the reliability concerning optical alignments between optical devices and optical fibers, and moisture-proof and vibration-proof characteristics can be improved, the optical connector module being electrically connected between devices so that the optical connector module can be used in typical devices.

Accordingly, to achieve the above objective, there is provided an optical connector module for connecting between a first device and a second device and transmitting information signals from one device to the other, comprising: a first connector module for being connected to a first device, for being electrically detachable, and for converting electrical signals from the first device into optical information signals; an optical fiber cable, one end of which is disposed to face the first connector module for transmitting the input optical information signal to the other end; and a second connector module for being connected to a second device, for being electrically detachable, and for converting the optical information signals transmitted through the optical fiber cable into electrical information signals and applying the electrical information signals to the second device.

Further, there is provided an optical connector module for connecting between a first device outputting electrical information signals and a second device receiving optical information signals, comprising: a first connector module for being connected to the first device, for being electrically detachable, and for converting electrical signals from the first device into optical information signals; an optical fiber cable one end of which is disposed to face the first connector module for transmitting the input optical information signal to the other end; and a second connector module installed at the other end of the optical fiber cable for connecting the optical fiber cable to the second device.

Furthermore, there is provided an optical connector module for connecting a first device outputting optical information signals and a second device having a port for receiving electrical information signals, comprising: an optical fiber cable, one end of which is disposed to face the first connector module, for transmitting the input optical information signal to the other end; a first connector module for connecting the optical fiber cable to the first device; and a second connector module for being connected to the second device, for being electrically detachable, and for converting the optical signals transmitted through the optical fiber cable into electrical information signals and supplying the is electrical information signals to the second device.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 2:
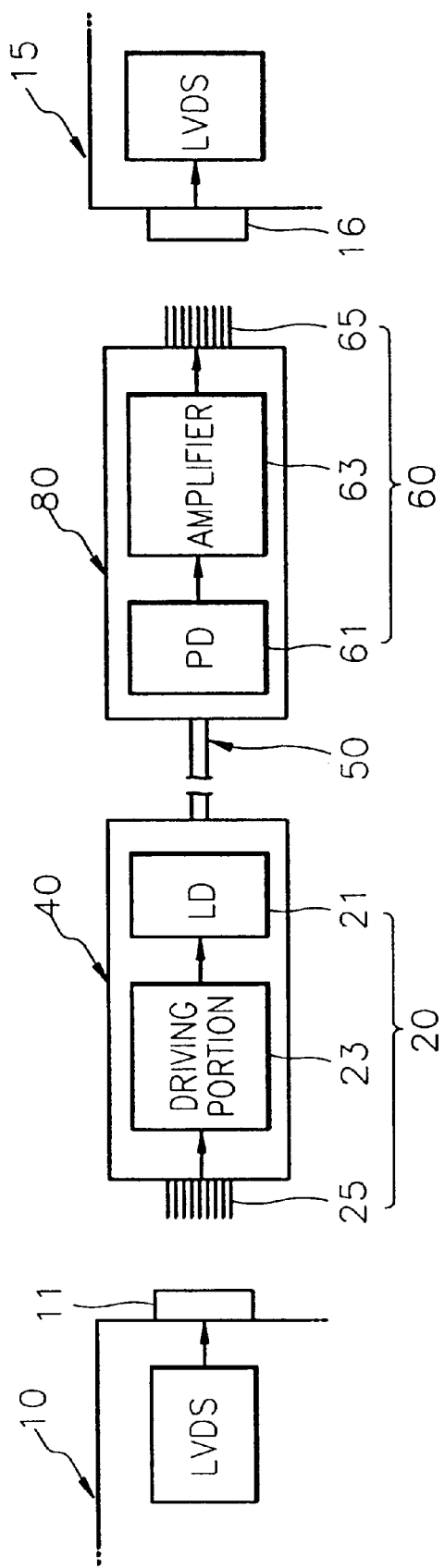
FIG. 2 is a block diagram schematically illustrating an optical connector module according to a first embodiment of the present invention.

Referring to FIG. 2, an optical connector module according to a first embodiment of the present invention is connected between a first device 10, having a port 11 from which electrical information signals are output, and a second device 15 having a port 16 into which electrical information signals are input. The optical connector module converts input electrical information signals into optical information signals, transmits the converted optical signals through optical media and again converts the transmitted optical information signal into electrical information signals.

To this end, the optical connector module comprises a first connector module which is electrically and detachably connected to the first device 10, converting electrical signals from the first device 10 into optical information signals; an optical fiber cable 50, one end of which is disposed to face the first connector module and which transmits input optical information signals to the other end, i.e., the output end; and a second connector module which is electrically and detachably connected to the second device 15, converting the optical information signals transmitted via the optical fiber cable 50 into electrical information signals, and applying the electrical information signals to the second device 15.

Here, the first connector module comprises a light emitting unit 20 for converting input electrical information signals into optical information signals, and a first connector for connecting the light emitting unit 20 and one end of the optical fiber cable 50.

In addition, the second connector module comprises a light receiving unit 60 for converting the optical information signals transmitted via the optical fiber cable 50 into electrical information signals, and a second connector for connecting the other end of the optical fiber cable 50 to the light receiving unit 60.

The light emitting unit 20 comprises first electrical terminals 25 coupled to the port 11 of the first device 10, light emitting devices (LD) 21 for generating and emitting light beams according to input electrical signals, and a driving portion 23 for driving the light emitting devices 21. The driving portion 23 is installed between the first electrical terminals 25 and the light emitting devices 21, is driven by electrical information and control signals, and controls the light emitting devices 21. The light emitting devices 21 can be embodied by a vertical cavity surface emitting laser array which is linearly arrayed and emits a plurality of light beams independently. In addition, the light emitting devices 21 can be embodied by a LED array having a linear array.

Figure 3:
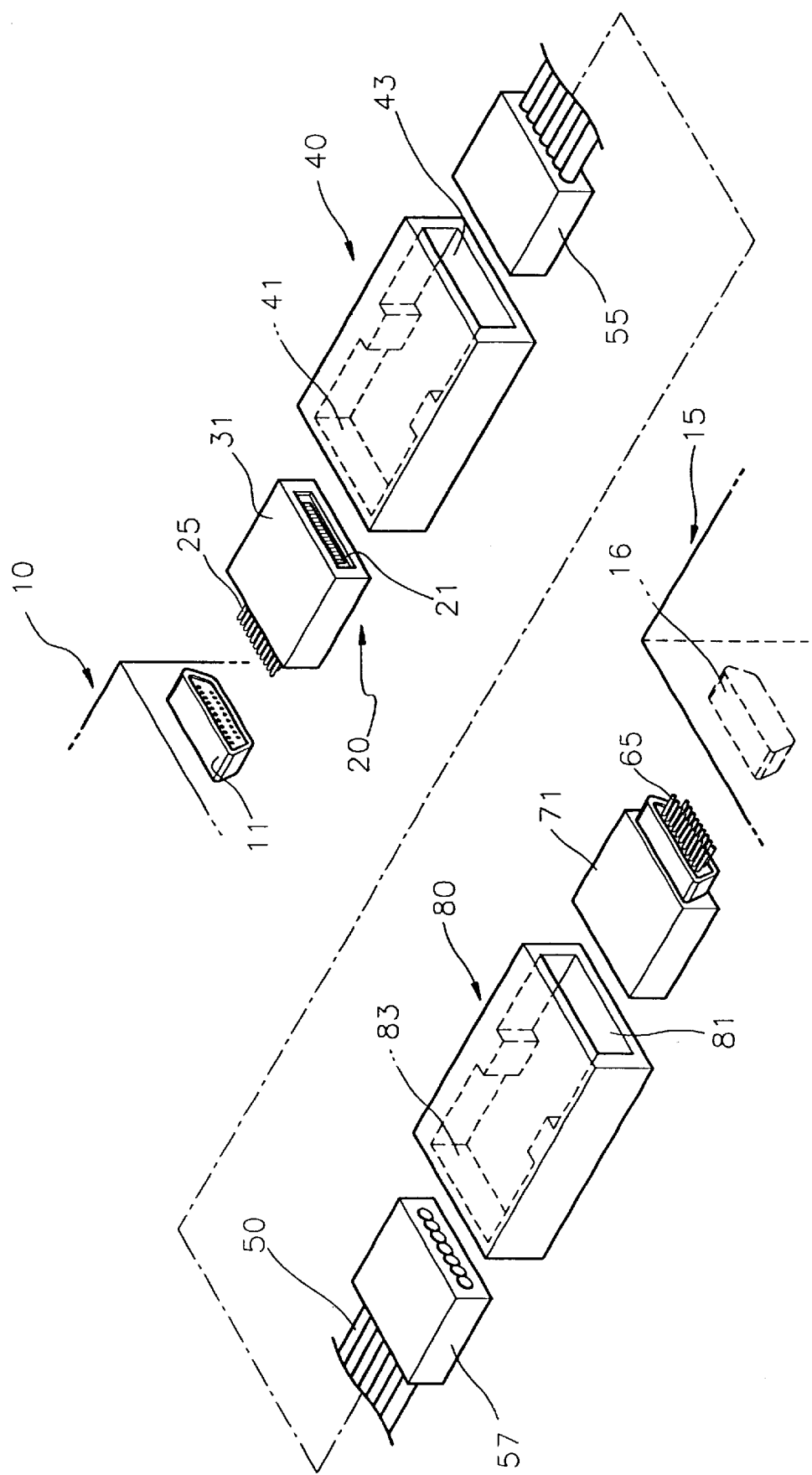
FIG. 3 is an exploded perspective view illustrating the assembly structure of first and second connectors according to the present invention.
Figure 4:
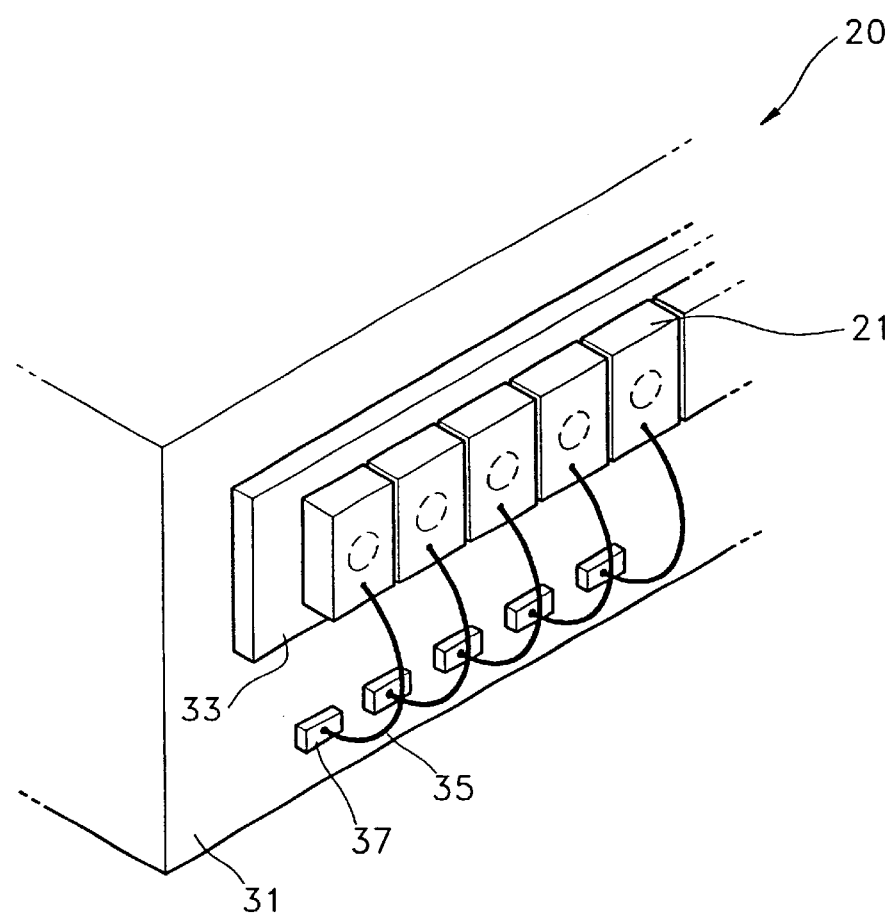
FIG. 4 is a perspective view illustrating a portion of a light emitting unit according to the present invention.

Referring to FIGS. 3 and 4, the light emitting unit 20 further comprises a first housing 31 formed to be easily connected to the first device 10 and fitted into the first connector 40, a first substrate 33 formed at one side of the first housing 31, and first electrodes 37 for connecting the light emitting devices 21 to the first electrical terminals 25. The first housing 31 is inserted and fitted into a first assembly hole 41 of the first connector 40, and guides the light emitting unit 20 to an assembly position with respect to the optical fiber cable 50. Preferably, the first housing 31 is made of insulator so as to be electrically insulated from the first electrical terminals 25, the first substrate 33 and the first electrodes 37.

On the other hand, in order to establish a suitable connection between the light emitting unit 20 and the optical fiber cable 50, a second assembly hole 43 is formed at the first connector 40 and a first optical fiber housing 55 is installed at one end of the optical fiber cable 50. When the first optical fiber housing 55 is inserted into the second assembly hole 43, the first optical fiber housing 55 serves to guide the optical fiber cable 50 so that the optical fiber cable 50 can be aligned with the light emitting unit 20. The optical fiber cable 50 contains a plurality of optical fibers corresponding to the number of light emitting devices 21.

Here, the connection structure between the first housing 31 and the first optical fiber housing 55 by the first connector 40 and the dimensions thereof are determined at an initial stage of manufacturing the optical connector module, and the structure remains unseparated when the optical connector module is normally used. Therefore, alignment errors between the light emitting devices 21 and the optical fiber cable 50, which occur with repeated use of the conventional optical connector module can be fundamentally prevented. In addition, since the first housing 31 and the first optical fiber housing 55 can be hermetically joined with respect to the first connector 40, moisture-proof and vibration-proof characteristics can be obtained.

The first substrate 33 is formed at one side of the first housing 31, and the light emitting devices 21 are installed on the first substrate 33 in electrically grounded states. In each of the first electrodes 37, one end of each of the first electrodes 37 is projected toward the first substrate 33 and bonded to corresponding light emitting devices 21 by a wire 35 to be electrically connected thereto, and the other end is connected to one of the first electrical terminals 25.

Figure 5:
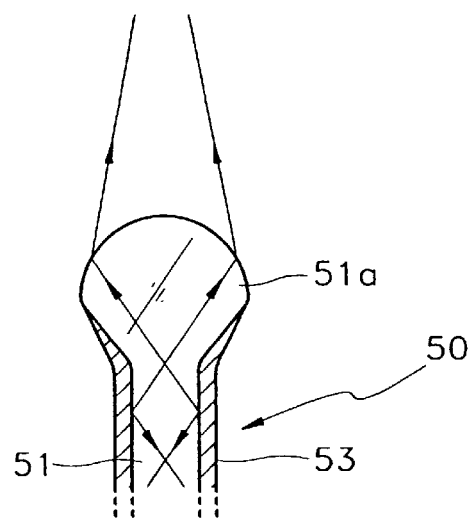
FIG. 5 is a sectional view schematically illustrating an end portion of an optical fiber cable according to the present invention.

The ends of the optical fiber cable 50 are disposed to face the light emitting unit 20 and the light receiving unit 60, respectively, and the optical fiber cable 50 transmits optical signals input from the light emitting unit 20 to the light receiving unit 60. Referring to FIG. 5, each fiber of the optical fiber cable 50 comprises a core 51 and a cladding 53 sheathing the core 51, and an incident light beam can be transmitted to the other end due to the difference in refractive indices of the core 51 and the cladding 53. The flux density of an incident light beam entering into the core 51 is one factor in determining the light transmission efficiency. In addition, it is necessary to converge the transmitted light beam so that nearly all the light beams transmitted through each fiber of the optical fiber cable 50 can enter into the light receiving unit 60.

Considering this fact, it is preferable that a bulged portion 51a is formed at at least one end of the core 51 so that each fiber of the optical fiber cable 50 can converge an entering or exiting light beam. In addition, as the optical fibers of the optical fiber cable 50, plastic optical fibers cheaper than glass optical fiber may be employed. In this case, there are advantages in which damage to optical fibers due to external impact can be reduced, and the bulged portion 51a can be easily formed.

Referring to FIG. 2, the light receiving unit 60 comprises light receiving devices (PD) 61 disposed to face the other end of the optical fiber cable 50 for receiving the optical information signals transmitted through the optical fiber cable 50 and converting the optical signals into electrical information signals, an amplifier 63 for amplifying the signals output from the light receiving devices 61, and second electrical terminals 65 coupled to the port 16 of the second device 15 for transmitting the converted electrical information signals from the light receiving devices 61 to the second device 15.

The light receiving devices 61 are linearly arrayed, and are embodied by a photodetector array of photodiodes, phototransistors or the like, so that the array can receive light beams, which are emitted from the light emitting devices 21 and transmitted via the optical fiber cable 50, where each photodetector converts the optical signal into an electrical signal, independently.

Figure 6:
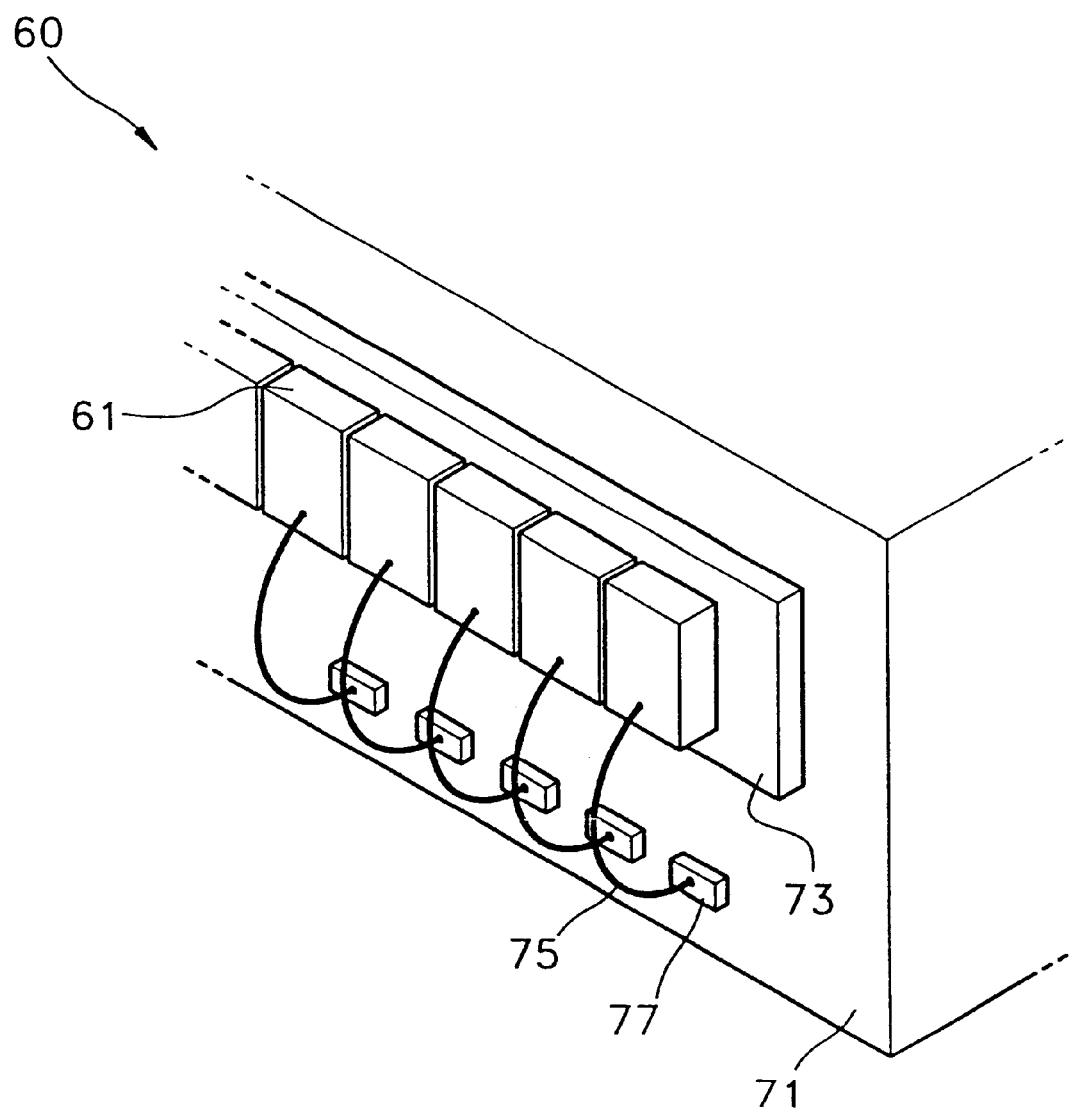
FIG. 6 is a perspective view illustrating a portion of a light receiving unit according to the present invention.

As shown in FIGS. 3 and 6, the light receiving unit 60 further comprises a second housing 71 formed to be easily connected to the second device 15 and fitted into the second connector 80, a second substrate 73 formed at one side of the second housing 71, and second electrodes 77 for connecting the light receiving devices 61 to the second electrical terminals 65. The second housing 71 is inserted and fitted into a third assembly hole 81 of the second connector 80, and guides the light emitting unit 60 to an assembly position with respect to the other end of the optical fiber cable 50. It is preferable that the second housing 71 is made of insulator so as to be electrically insulated from the second electrical terminals 65, the second substrate 73 and the second electrodes 77. On the other hand, in order to establish a suitable connection between the light emitting unit 60 and the optical fiber cable 50, a fourth assembly hole 83 is formed at the second connector 80, and a second optical fiber housing 57 is installed at the other end of the optical fiber cable 50. When the second optical fiber housing 57 is inserted into the fourth assembly hole 83, the second optical fiber housing 57 serves to guide the optical fiber cable 50 so that the optical fiber cable 50 can be aligned with the light emitting unit 60.

Though the first embodiment has been described with reference to a one-way signal transmission system configured so that information signals can be transmitted from the first device 10 to the second device 15, a two-way signal transmission system between the first and second devices 10 and 15 can be embodied by further providing the first connector module with a light receiving unit and providing the second connector module with a light emitting unit. In this case, the light emitting unit and the light receiving unit may be integrally provided in the first connector, or may be installed in separate connectors.

As described above, the optical connector module which is provided with the light emitting unit 20 having the light emitting devices 21 and the driving portion 23, and the light receiving unit 60 having the light receiving devices 61 and an amplifier 63 are very advantageous when employed in a system transmitting low voltage differential signals (LVDSs) via the ports 11 and 16 of the first and second devices 10 and 15. LVDS signaling refers to, for example, when the first device 10 is the motherboard of a computer and the second device 15 is a flat panel display such as a LCD. LVDS signaling is used as a process of converting parallel pixel data into high-speed low power serial data, or again converting the serial data into parallel data so as to display images on the LCD.

Figure 7:
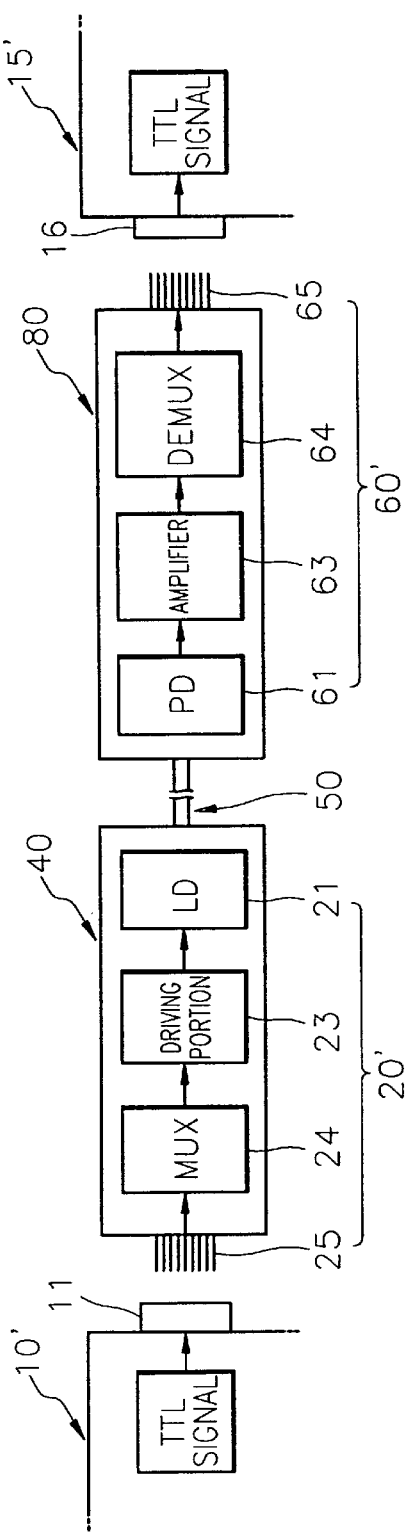
FIG. 7 is a block diagram illustrating an embodiment further comprising a multiplexer and a demultiplexer in the first and second connector modules of FIG. 2, respectively.

In addition, as shown in FIG. 7, a light emitting unit 20' further comprises a multiplexer (MUX) 24 which selects any one signal among a plurality of input electrical information signals according to a selection control signal and controls a driving portion 23, and the light receiving unit 60' further comprises a demultiplexer (DEMUX) 64. The multiplexer 24 is electrically connected between first electrical terminals 25 of the light emitting unit 20' and the driving portion 23, and the demultiplexer 64 is connected between an amplifier 63 of the light receiving unit 60' and second electrical terminals 65. The optical connector module configured as above is very advantageous when employed in a system in which transistor-transistor logic (TTL) signals, which can be transmitted at high speed with low power consumption, are transmitted via ports 11 and 16 of first and second devices 10' and 15'.

Figure 8:
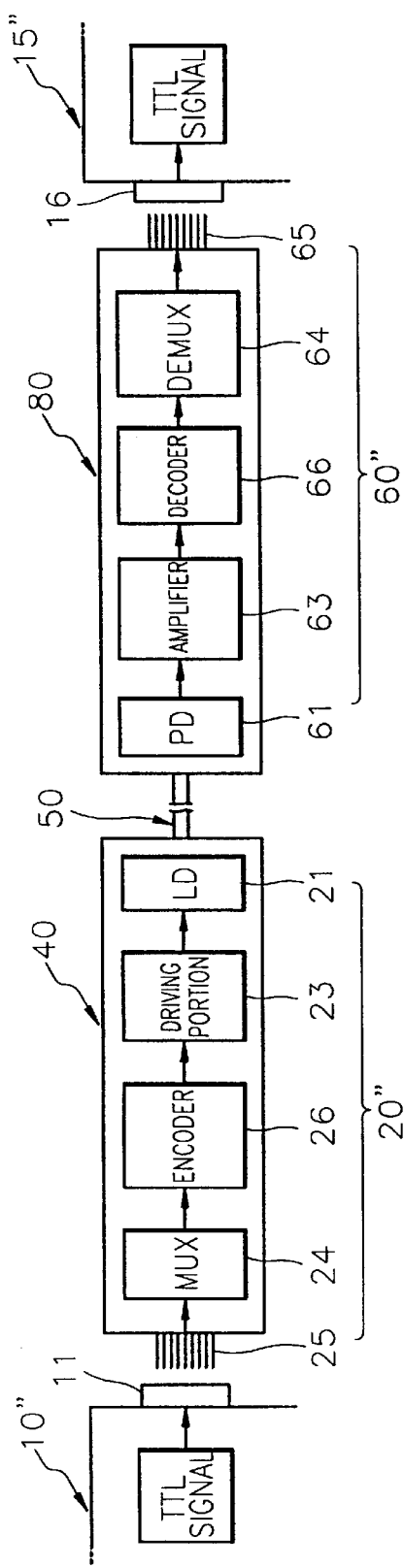
FIG. 8 is a block diagram illustrating an embodiment further comprising an encoder and a decoder in the first and second connector modules of FIG. 7, respectively.

Referring to FIG. 8, a light emitting unit 20" may further comprise an encoder 26 for encoding input information signals, and a light receiving unit 60" may further comprise a decoder 66 for decoding the information signals encoded by the encoder 26. The optical connector module configured as above can be advantageously employed in a system in which TTL signals are transmitted through ports 11 and 16 of first and second devices 10" and 15", and transmission errors can be reduced by encoding and decoding information signals.

Figure 9:
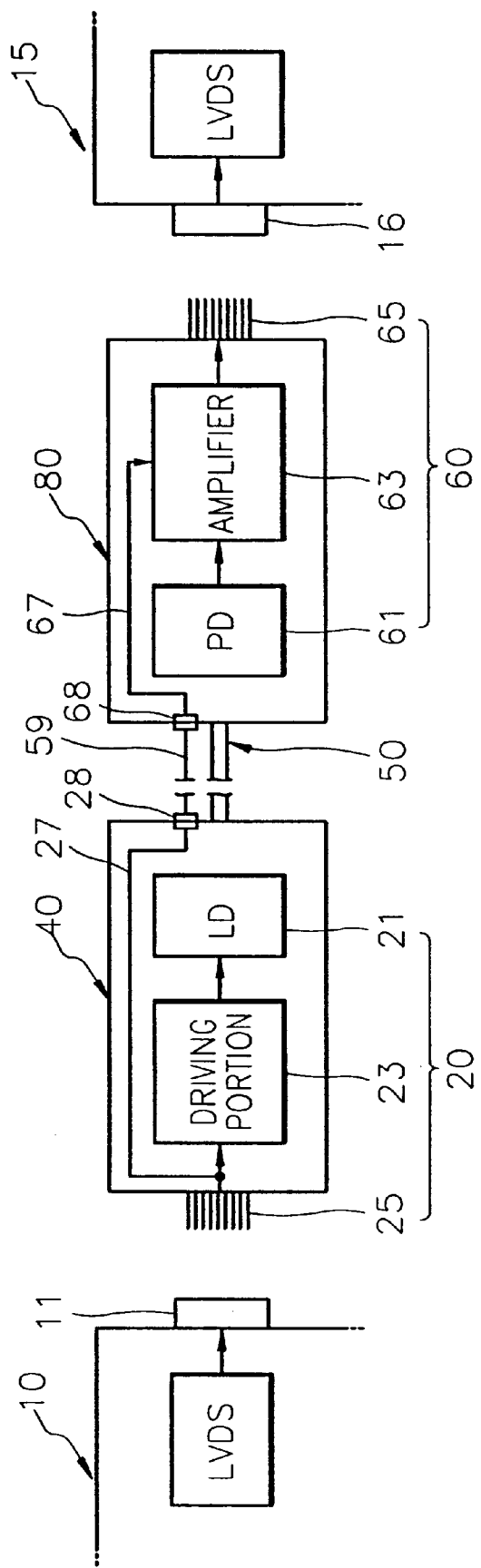
FIG. 9 is a block diagram schematically illustrating an optical connector module according to a second embodiment of the present invention.

Referring to FIG. 9, an optical connector module according to a second embodiment of the present invention is characterized in that the optical connector module further comprises a structure for applying electrical power, supplied from a first device 10, to an amplifier 63, by comparison with the optical connector module previously described with reference to FIG. 3.

To this end, the structure includes a first power transmitting portion 27 installed in a first connector 40 for transmitting the electrical power supplied from the first device 10 to the other end, a power line 59, and a second power transmitting portion 67 installed in a second connector 80. The first power transmitting portion 27 receives power supplied from the first device 10 via one of first electrical terminals 25 and transmits power to the power line 59. Here, the first power transmitting portion 27 and the power line 59 are connected by a first electrical connecting portion 28. The second power transmitting portion 67 is installed in the second connector 80, one end of the second power transmitting portion 67 is connected to the power line 59 at a second connecting portion 68, and the other end is connected to the amplifier 63. When the structure for supplying power to the amplifier 63 is configured as above, there is an advantage in which the power for driving the amplifier 63 need not be supplied from a second device 15.

Here, since the electrical connections between the power line 59 and the first and second power transmitting portions 27 and 67 can be established by employing a general connector structure, a detailed description thereof will be omitted.

Figure 10:
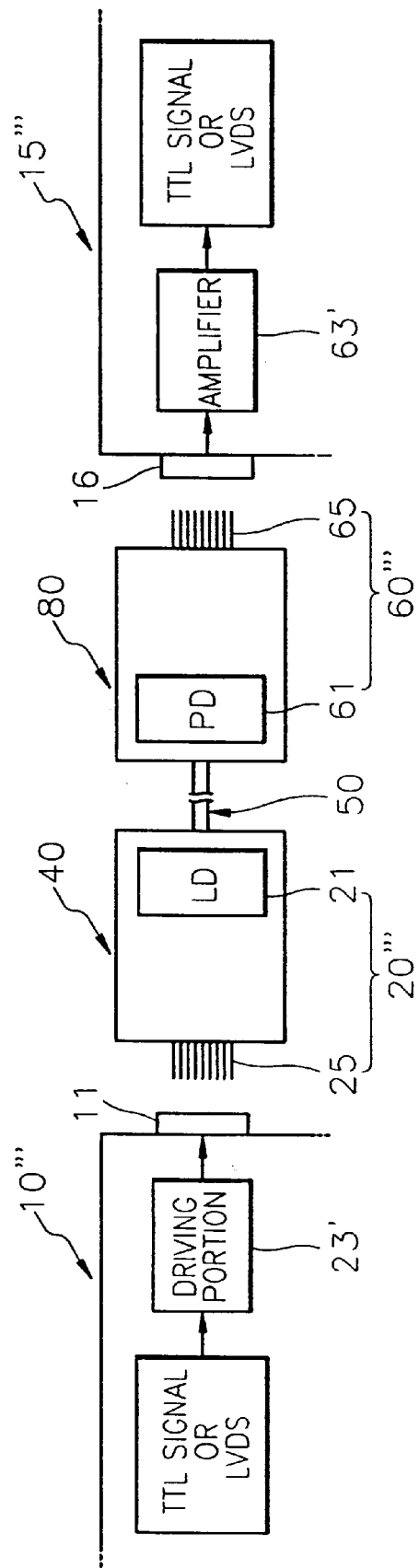
FIG. 10 is a block diagram schematically illustrating an optical connector module according to a third embodiment of the present invention.

Referring to FIG. 10, an optical connector module according to a third embodiment of the present invention is intended to be used in a case in which a driving portion 23' and an amplifier 63' are installed in first and second devices 10''' and 15''', respectively. The optical connector module according to the third embodiment comprises a light emitting unit 20''', an optical fiber cable 50 for transmitting input optical information signals from one end to the other end, a first connector 40 for connecting the light emitting unit 20''' and one end of the optical fiber cable 50, a light receiving unit 60''' for converting the optical information signals transmitted through the optical fiber cable 50 into electrical information signals, and a second connector 80 for connecting the other end of the optical fiber cable 50 and the light receiving unit 60'''.

Here, the light emitting unit 20''' comprises a light emitting device 21. The light emitting device 21 is installed in the first connector 40, and the driving portion 23' is installed in the first device 10'''.

The light receiving unit 60''' comprises light receiving devices 61 for receiving the optical signals transmitted through the optical fiber cable 50. The light receiving devices 61 are installed in the first connector 80, and the amplifier 63' is installed in the second device 15'''.

Therefore, since the first and second connectors 40 and 80 have structures excluding a driving portion and an amplifier, respectively, the above optical connector module is advantageously employed in devices already provided with a driving portion 23' and an amplifier 63'.

Figure 11:
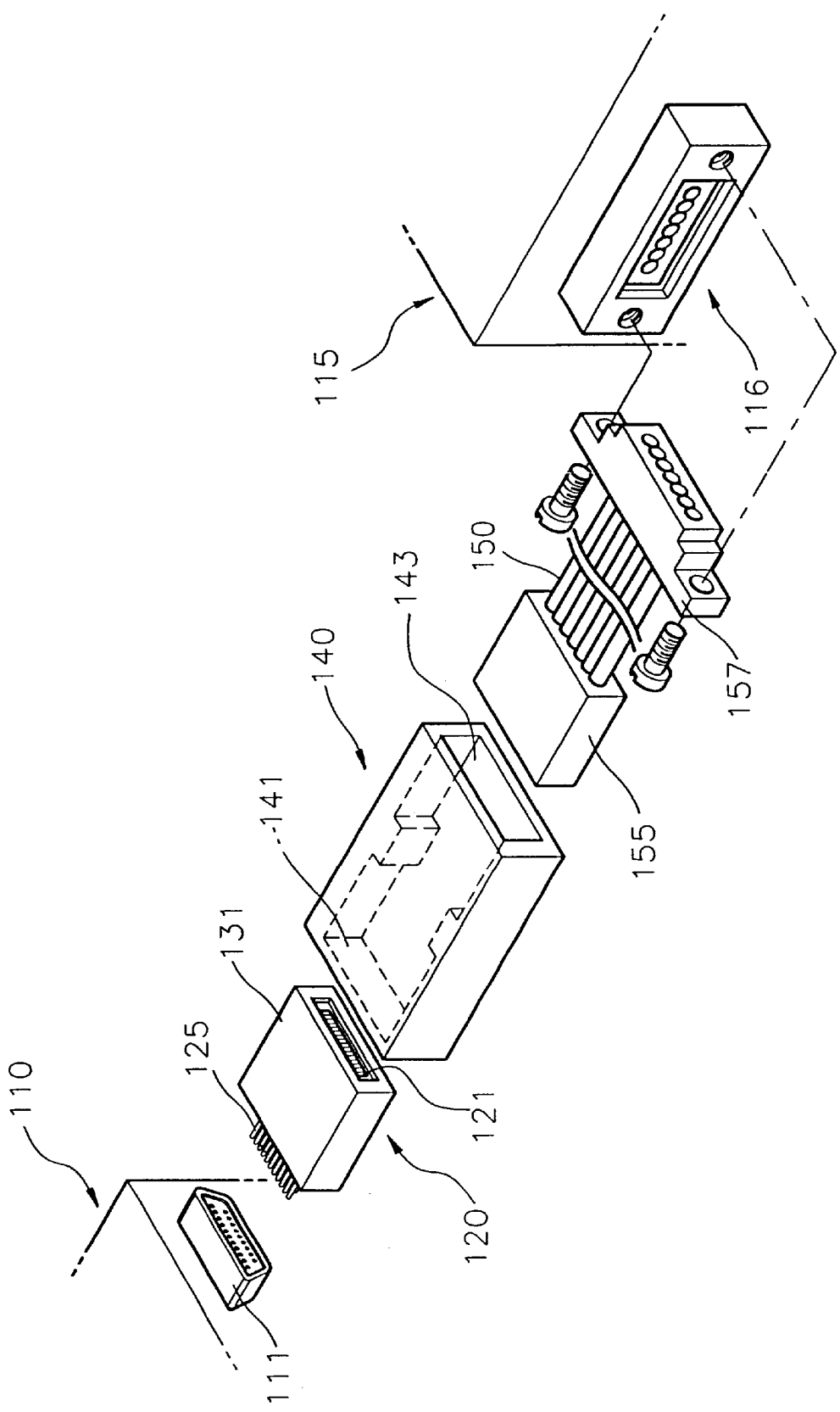
FIGS. 11 and 12 are a perspective view and a block diagram schematically illustrating an optical connector module according to a fourth embodiment of the present invention.

Referring to FIG. 11, an optical connector module according to a fourth embodiment of the present invention relates to a module connected between a first device 110, having a port 111 for outputting electrical signals as information signals, and a second device 115 having a port 116 for being input with optical information signals.

Figure 12:
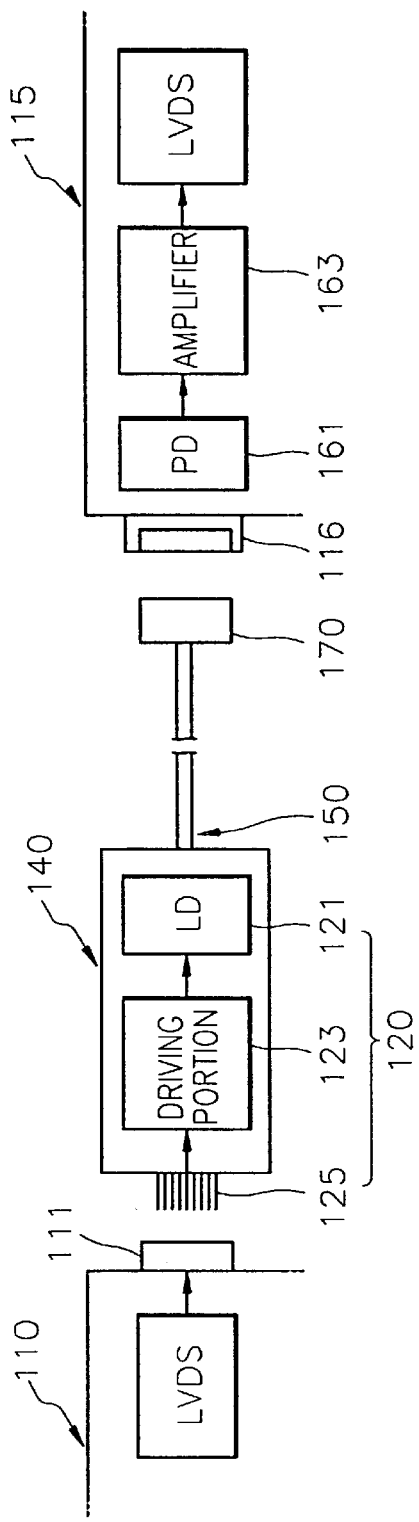

Here, as shown in FIGS. 11 and 12, the second device 115 comprises an optical port 116 and light receiving devices 161 for converting the optical signals input via the port 116 into electrical information signals, and an amplifier 163 for amplifying the electrical information signals detected by the light receiving devices 161.

The optical connector module according to the fourth embodiment of the present invention comprises a first connector module joined to the first device 110 and electrically connected to or disconnected from the first device 110 for converting the electrical information signals from the first device 110 into optical information signals, an optical fiber cable 150 for transmitting the optical signals input through one end thereof to the other end, and a second connector module 170 for connecting the optical fiber cable 150 to the port 116 of the second device 115.

The first connector module comprises a light emitting unit 120 for emitting light beams according to the input electrical information signals, a first connector 140 for connecting the light emitting unit 120 and the optical fiber cable 150 so that the light emitting unit 120 and the optical fiber cable 150 can be aligned with each other while maintaining a predetermined distance. The light emitting unit 120 comprises electrical terminals 125 which are electrically connected to the port 111 of the first device 110 and to which electrical signals including electrical information signals are input, light emitting devices 121 for converting the input electrical information signals into optical information signals, and a driving portion 123 for driving the light emitting devices according to the input electrical information signals. The first connector 140 connects the light emitting unit 120 and the optical fiber cable 150 so that the light emitting unit 120 and the optical fiber cable 150 can be aligned with each other while maintaining a predetermined distance, and guides the connection of the optical fiber cable 150 to the port 111 of the first device 110. The light emitting unit 120 comprises a housing 131 made of insulator and connected to the first connector 140 for guiding the light emitting devices 121 to their assembly positions with respect to the optical fiber cable 150, a substrate formed at one side of the housing 131 in an electrically grounded state and on which the light emitting devices 121 are installed, and electrodes, one end of each projecting to the vicinity of the substrate and bonded to a corresponding light emitting device 121 by a wire to be electrically connected thereto, and the other end connected to a corresponding first electrical terminal 125.

Here, since the housing, substrate and electrodes are the same as the first housing, first substrate and first electrodes of the optical connector module according to the first embodiment described with reference to FIG. 4, a detailed description and drawing thereof will be omitted. In addition, each fiber of the optical fiber cable 150 may be provided with a bulged portion at one end thereof as shown in FIG. 5 referred to previously.

Figure 1:
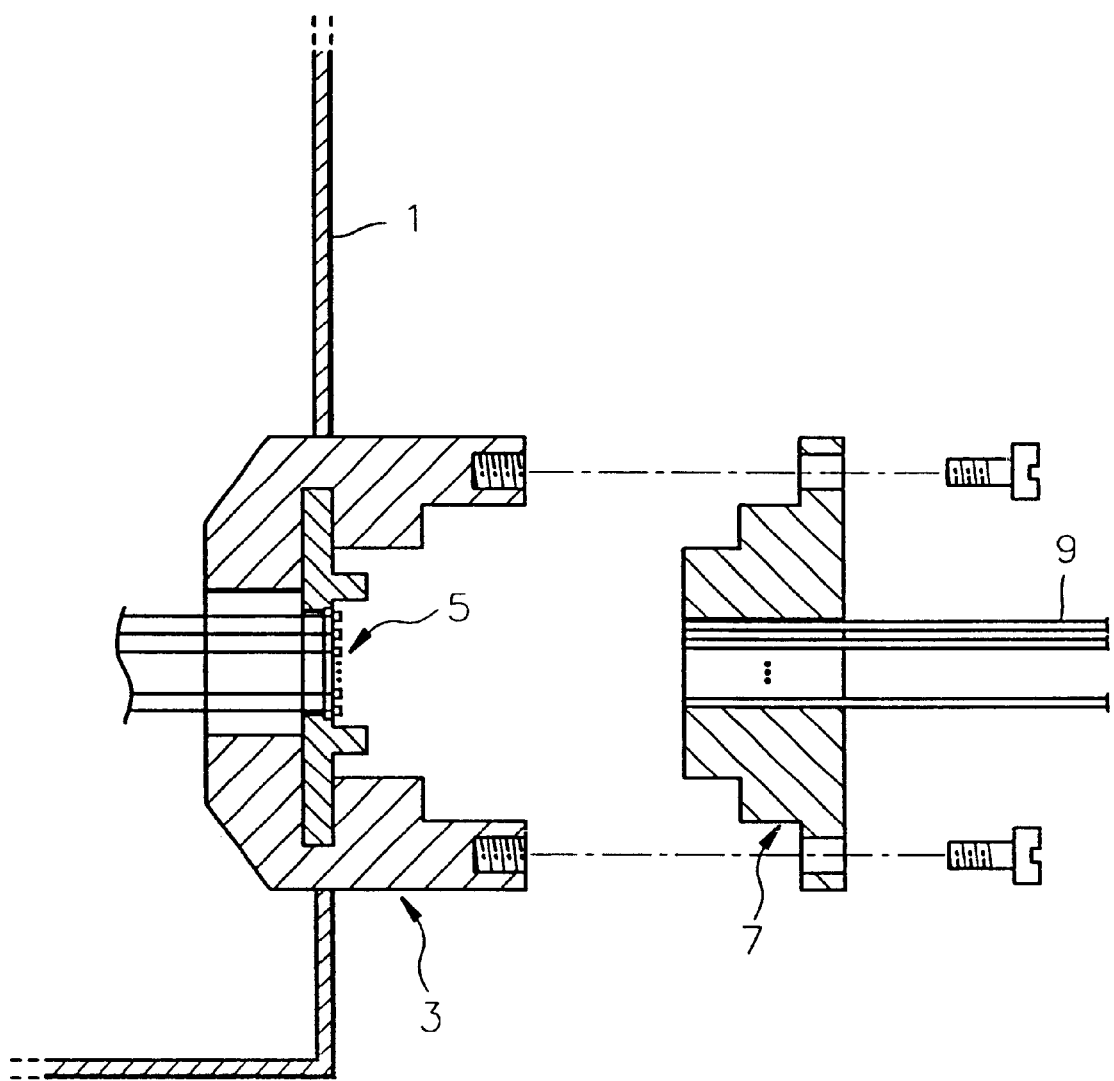
FIG. 1 is a sectional view illustrating a conventional optical connector module.

On the other hand, the second connector module 170 is intended for an optical connection to the second device 115, and since the connection structure to the port 116 of the second device 115 is substantially the same as that of the conventional optical connector module described with reference to FIG. 1, a detailed description thereof will be omitted.

Figure 13:
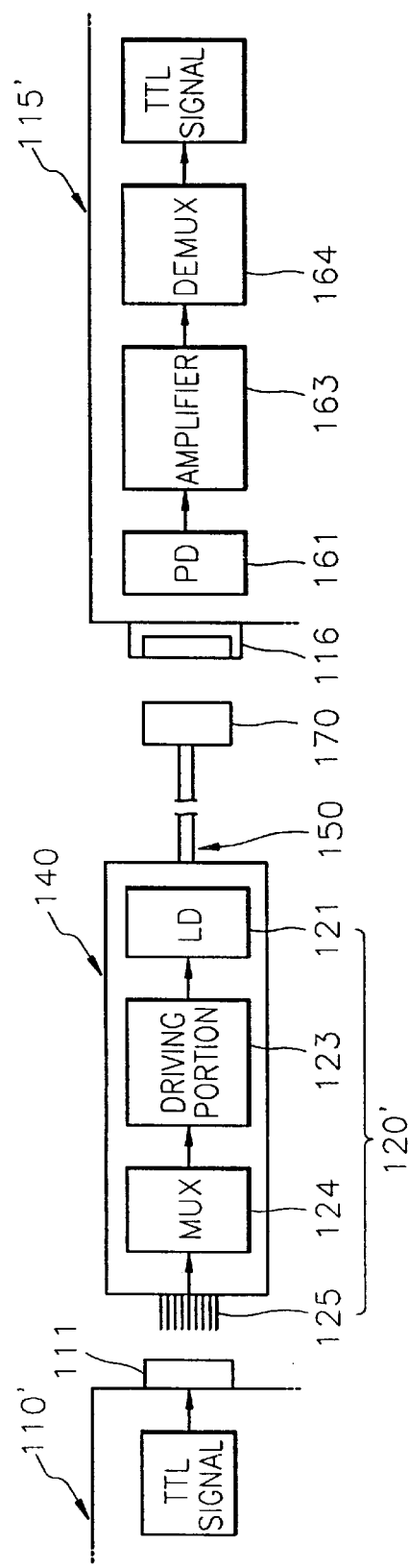
FIG. 13 is a block diagram schematically illustrating an embodiment further comprising a multiplexer in the first connector module of FIG. 12.

Here, as shown in FIG. 13, the first connector module 140 may further comprise a multiplexer so as to be adapted to the second device 115' having a demultiplexer 164.

The multiplexer 124 is provided between the electrical terminals 125 and a driving portion 123, and selects any one signal among a plurality of input electrical information signals according to a selection control signal and controls the driving portion 123.

Figure 14:
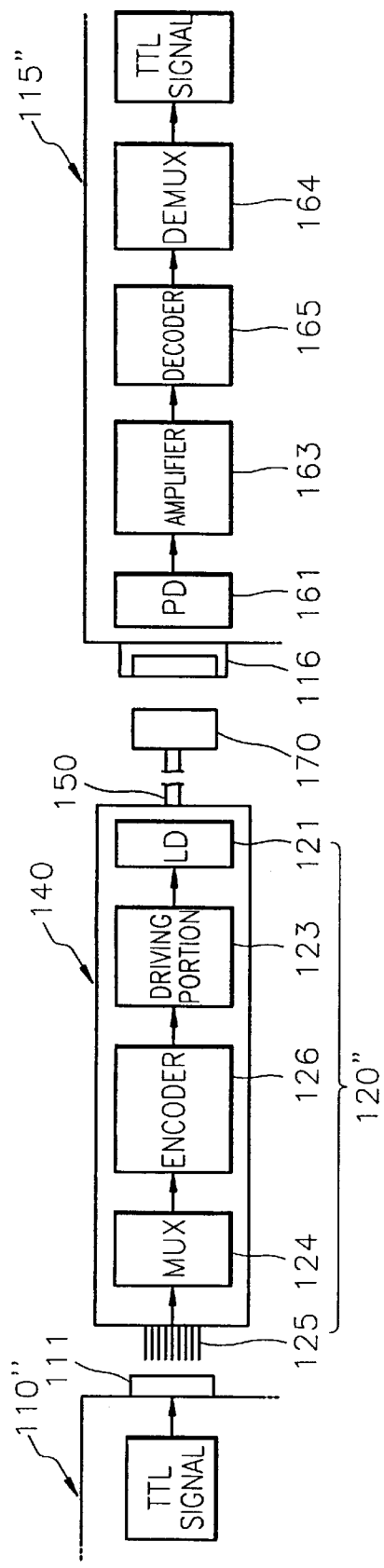
FIG. 14 is a block diagram schematically illustrating an embodiment further comprising an encoder in the first connector module of FIG. 13.

In addition, as shown in FIG. 14, a light emitting unit 120" may comprise an encoder 126 so as to be adapted to the second device 115" having a decoder 165 for decoding the information signals input thereinto.

Figure 15:
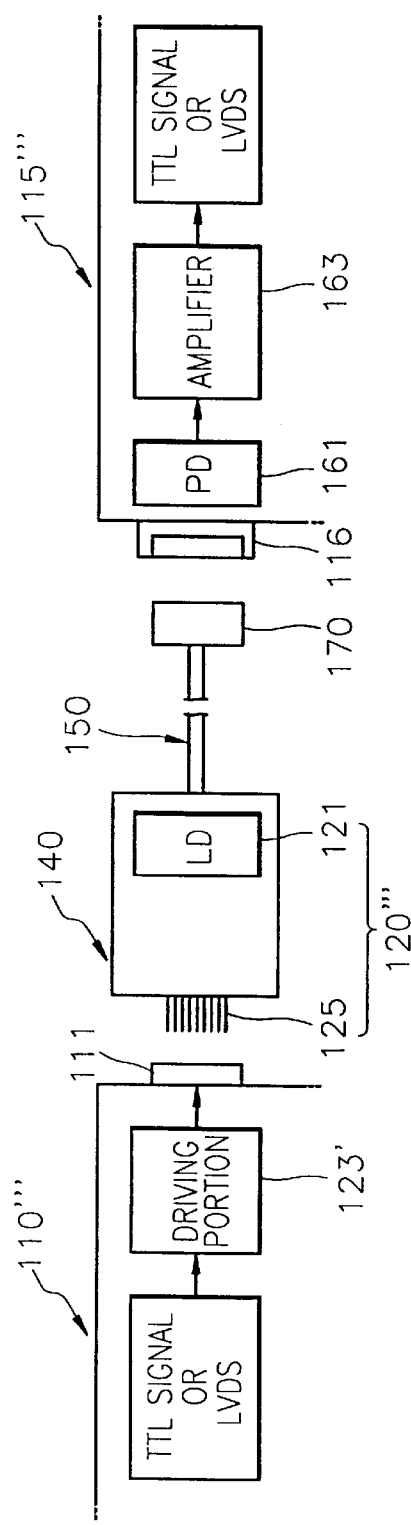
FIG. 15 is a block diagram schematically illustrating an optical connector module further comprising a driving portion in the first device of FIG. 12.

On the other hand, as shown in FIG. 15, a light emitting unit 120'" may exclude a driving portion therefrom so as to be adapted to a first device 110'" provided with a driving portion 123' therein. In this case, the light emitting devices 121 of the light emitting unit 120'" are driven by the electrical information and driving signals supplied from the driving portion 123' and transmitted via electrical terminals 125.

Figure 16:
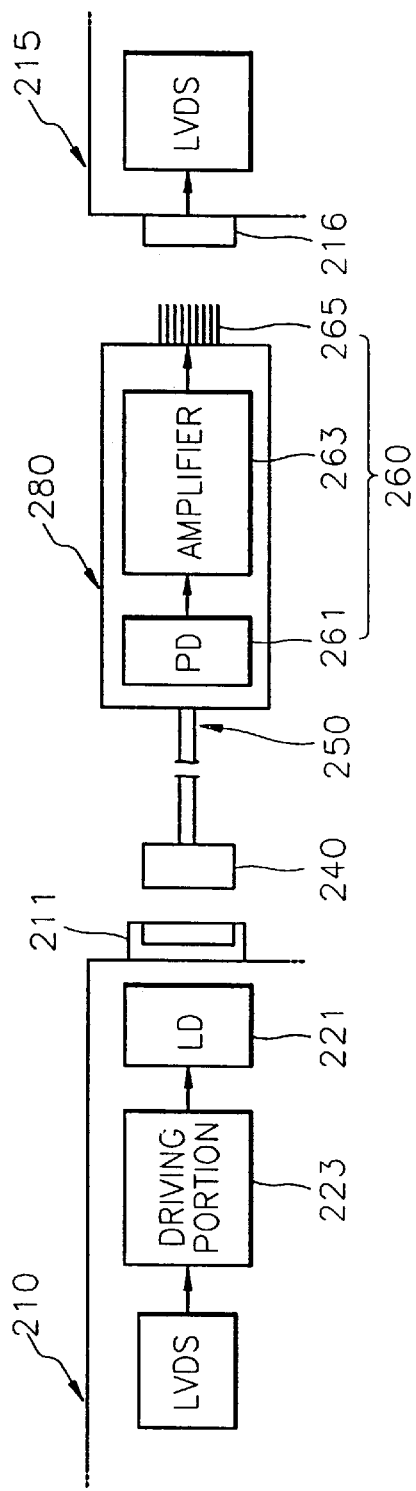
FIG. 16 is a block diagram schematically illustrating an optical connector module according to a fifth embodiment of the present invention.

Referring to FIG. 16, an optical connector module according to a fifth embodiment of the present invention relates to a module which is connected between a first device 210 having a port 211 for outputting optical information signals, and a second device 215 having a port 216 for being input with optical information signals.

Here, the first device 210 comprises light emitting devices 221 for converting the input electrical information signals into optical information signals and transmitting the optical information signals to the port 211, and a driving portion 223 for driving the light emitting devices 221 according to input electrical information signals such as input LVDSs.

To this end, the structure comprises an optical fiber cable 250 for transmitting the input optical information signals emitted from the light emitting devices 221, a first connector module 240 for guiding the connection of the optical fiber cable 250 to the port 211 of the first device 210, and a second connector module installed at the other end of the optical fiber cable 250 to face the other end for converting the optical information signals into electrical information signals and transmitting the electrical information signals to the second device 215. Here, the second connector module includes light receiving unit 260 for converting the received light beams into electrical signals, and a second connector 280 for connecting the light receiving unit 260 and the optical fiber cable 250 so that the light receiving unit 260 and the optical fiber cable 250 can be aligned to each other while maintaining a predetermined distance.

The first connector module 240 is intended for the optical connection between the first device 210 and the optical fiber cable 250, and since the connection structure to the port 211 of the first device 210 is substantially the same as that of the conventional optical connector module described with reference to FIG. 1, a detailed description thereof will be omitted. The optical fiber cable 250 is connected to the first device 210 by the first connector 240 at one end thereof, and connected to the light receiving unit 260 by the second connector 280 at the other end. Preferably, each fiber of the optical fiber cable 150 may be provided with a bulged portion at one end thereof as shown in FIG. 5 referred to previously.

The light receiving unit 260 comprises light receiving devices 261 disposed to face the other end of the optical fiber cable 250 for converting the optical signals transmitted through the optical fiber cable 250 into electrical information signals, an amplifier 263 for amplifying the electrical information signals output from the light receiving devices 261, and electrical terminals 265 electrically coupled to the port 216 of the second device 215 for transmitting the converted electrical information signals from the light receiving devices 261 to the second device 215. In addition, the light receiving unit 260 comprises a housing connected to the second connector 280 for guiding the light receiving devices 261 to their assembly positions with respect to the optical fiber cable 250, a substrate which is formed at one side of the housing in an electrically grounded state and on which the light receiving devices 261 are installed, and electrodes, one end of each projecting to the vicinity of the substrate and bonded to a corresponding light receiving device 261 by a wire to be electrically connected thereto, and the other end of each electrode connected to a corresponding electrical terminal 265. Here, since the housing, substrate and electrodes are the same as the second housing, second substrate and second electrodes of the optical connector module according to the first embodiment described with reference to FIG. 4, a detailed description and a drawing thereof will be omitted.

Figure 17:
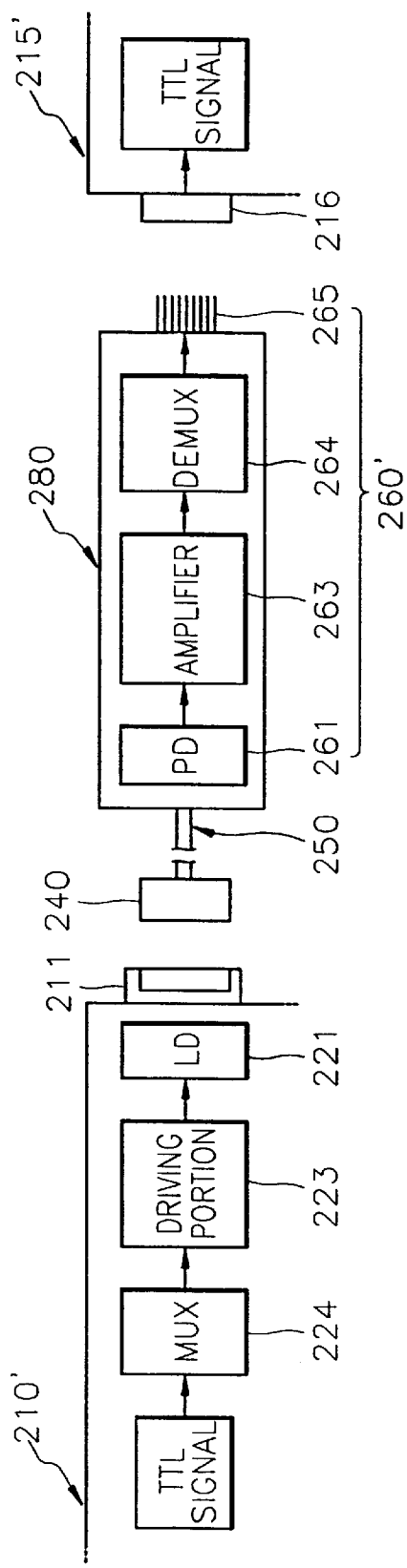
FIG. 17 is a block diagram schematically illustrating an embodiment further comprising a multiplexer and a demultiplexer in the second connector module of FIG. 16.

Here, as shown in FIG. 17, a light receiving unit 260' may further comprise a demultiplexer 264 so as to be adapted to the first device 210' having a multiplexer 224 therein.

Figure 18:
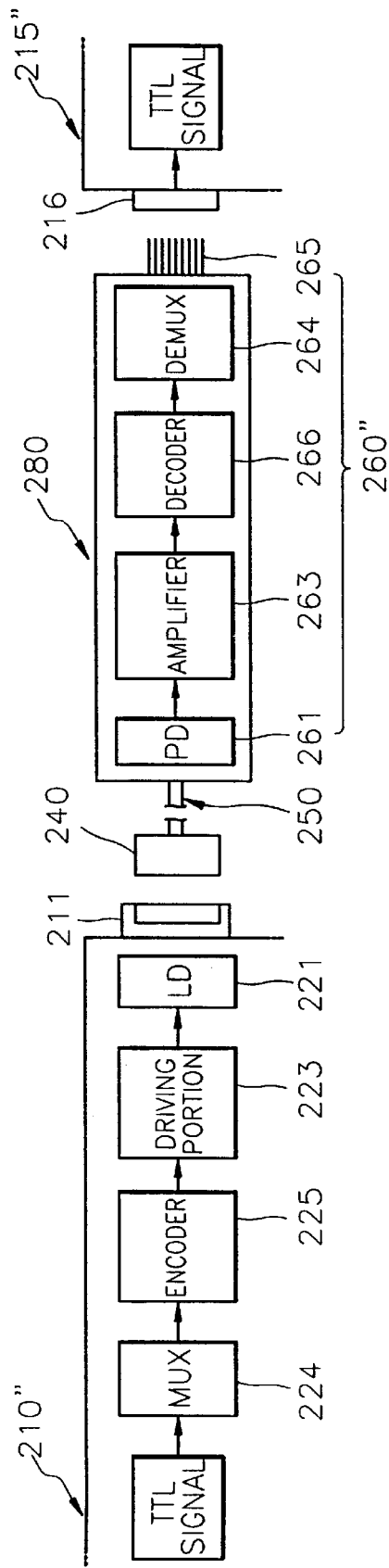
FIG. 18 is a block diagram schematically illustrating an embodiment further comprising a decoder in the second connector module of FIG. 17.

In addition, as shown in FIG. 18, in order to be adapted to the first device 210' which further comprises an encoder 225 for encoding the information signals input thereinto, a light receiving unit 260' may further comprise a decoder 266 for decoding the information signals encoded by the encoder 225.

Figure 19:
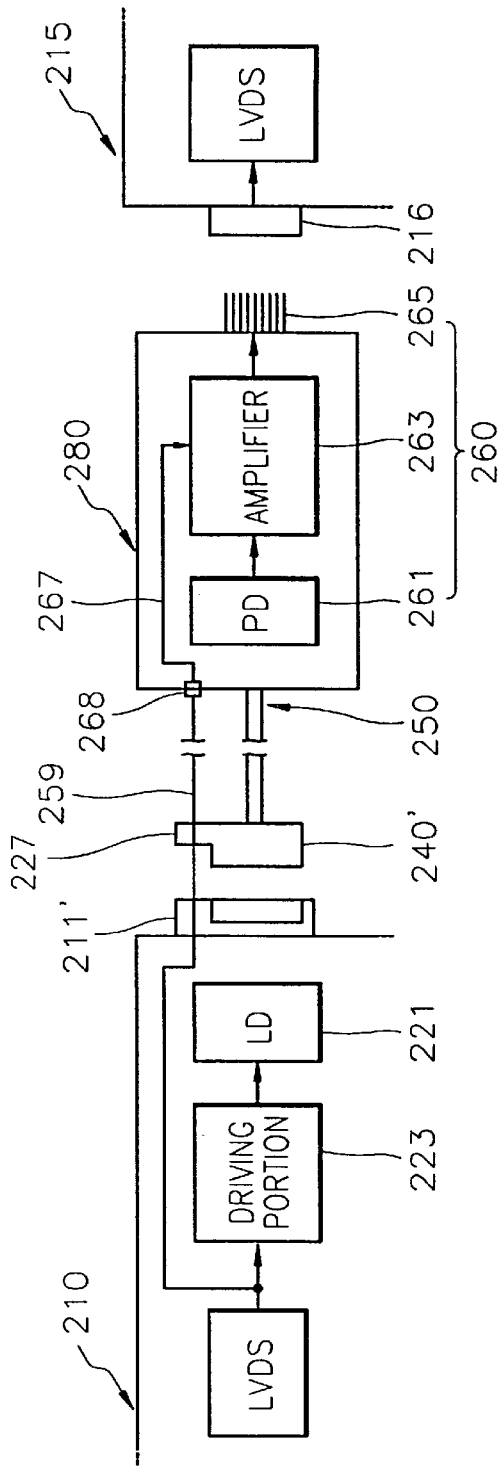
FIG. 19 is a block diagram schematically illustrating an optical connector module according to a sixth embodiment of the present invention.

Referring to FIG. 19, an optical connector module according to a sixth embodiment of the present invention is characterized in that the optical connector module further comprises a structure for applying electrical power supplied from a first device 210 to an amplifier 263, in comparison with the optical connector module previously described with reference to FIG. 16.

To this end, the structure includes a first device 210, a port 211' of the first device 210, a first power transmitting portion 227 installed in a first connector 240' for transmitting electrical power supplied from the first device 210 to the other end, a power line 259, and a second power transmitting portion 267 installed in a second connector 280. The first power transmitting portion 227 receives power supplied from the first device 210 via the port 211' and transmits power to the power line 259. The second power transmitting portion 267 is installed in the second connector 280, with one end of the second power transmitting portion 267 connected to the power line 259 at a connecting portion 268 and the other end connected to the amplifier 263. When the structure for supplying power to the amplifier 263 is configured as above, there is an advantage in that the power for driving the amplifier 263 need not be supplied from a second device 215.

Figure 20:
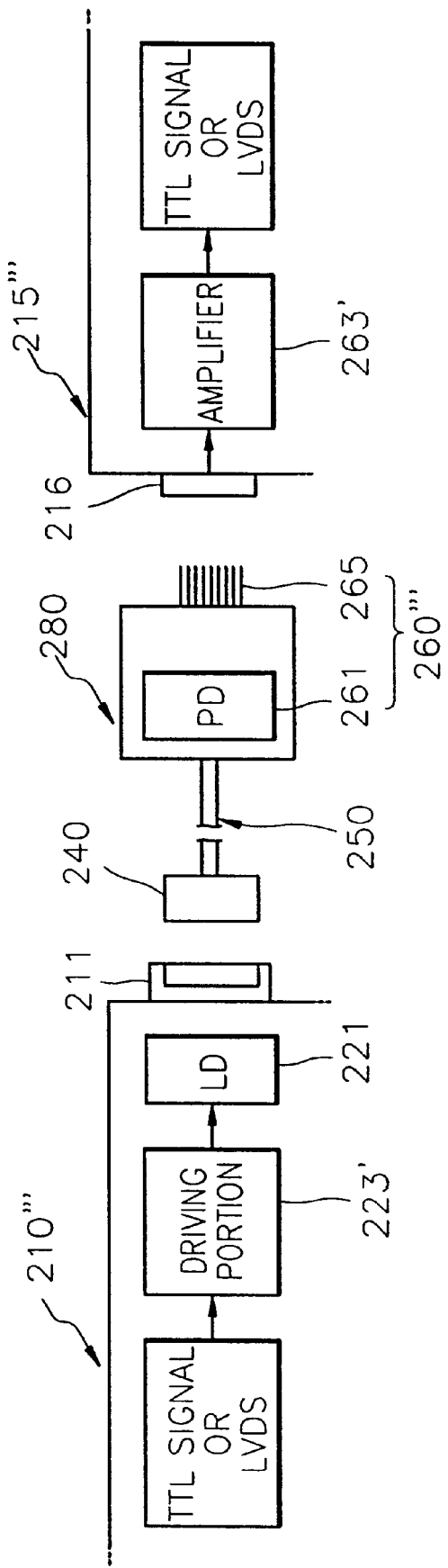
FIG. 20 is a block diagram schematically illustrating an optical connector module further comprising an amplifier in the second device of FIG. 15.

On the other hand, as shown in FIG. 20, a light receiving unit 260'" may exclude an amplifier therefrom so as to be adapted to a second device 215'" provided with an amplifier 263' for amplifying the electrical signals input into the second device 215'".

The optical connector module configured as above according to the present invention enables an information signal input end and/or an information signal output end of the module to be electrically connected to devices, and therefore the module can be generally used for typical devices so as to connect the devices. In addition, when the module has to be assembled to or disassembled from a device, the connection between light emitting devices and/or light receiving devices and optical fibers need not be separated, and therefore the reliability concerning optical alignments between optical devices and optical fibers, and moisture-proof and vibration-proof characteristics can be improved.

In addition, when the module employs a structure in which the power required to drive an amplifier disposed in a connector connected to a second device can be supplied from a first device, there is an advantage in that the power for driving the amplifier need not be supplied from a second device, and therefore the module can be generally used for a typical second device.

What is claimed is:

1. An optical connector module for connecting between a first device and a second device and transmitting information signals from one device to the other, comprising:

a first connector module for connecting to the first device, for being electrically detachable, and for converting electrical signals from the first device into optical information signals;

an optical fiber cable, one end of which is disposed to face the first connector module, for transmitting the optical information signals; and a second connector module for connecting to the second device, for being electrically detachable, and for converting the optical information signals transmitted through the optical fiber cable into electrical information signals and applying the electrical information signals to the second device;

wherein the first connector module comprises: a light emitting unit comprising first electrical terminals for electrically connecting to the first device, light emitting devices for emitting light beams according to the electrical signals input by the first electrical terminals, and a driving portion for driving the light emitting devices; and a first connector for connecting the light emitting unit and the optical fiber cable so that the light emitting unit and the optical fiber cable can be aligned with each other while maintaining a predetermined distance;

wherein the second connector module comprises: a light receiving unit comprising light receiving devices for receiving the optical information signals transmitted through the optical fiber cable and converting the optical information signals into converted electrical signals, an amplifier for outputting amplified signals based on the converted electrical signals, and second electrical terminals, for electrically connecting to the second device and transmitting the electrical information signals based on the amplified signals; and a second connector for connecting the light receiving unit and the optical fiber cable so that the light receiving unit and the optical fiber cable can be aligned to each other while maintaining a predetermined distance;

wherein the light emitting unit further comprises a multiplexer, provided between the first electrical terminals and the driving portion, for selecting any one electrical signal among the electrical signals according to a selection control signal, and wherein the light receiving unit further comprises a demultiplexer provided between the amplifier and the second electrical terminals.

2. The optical connector module as claimed in claim 1, wherein the light emitting unit further comprises an encoder for encoding the one electrical signal and outputting at least one encoded signal, and wherein the light receiving unit further comprises a decoder for decoding a signal corresponding to the at least one encoded signal.

3. The optical connector module as claimed in claim 1, wherein the first connector module comprises: a light emitting unit comprising first electrical terminals for electrically connecting to the first device, and light emitting devices for emitting light beams according to the electrical signals input by the first electrical terminals; and a first connector for connecting the light emitting unit and the optical fiber cable so that the light emitting unit and the optical fiber cable can be aligned with each other while maintaining a predetermined distance; and wherein the first device comprises a driving portion for driving the electrical signals to the light emitting devices; and wherein the second connector module comprises: a light receiving unit comprising light receiving devices for receiving the optical information signals transmitted through the optical fiber cable and converting the optical information signals into converted electrical signals, an amplifier for outputting amplified signals based on the converted electrical signals, and second electrical terminals, for electrically connecting to the second device and transmitting the electrical information signals based on the amplified signals; and a second connector for connecting the light receiving unit and the optical fiber cable so that the light receiving unit and the optical fiber cable can be aligned to each other while maintaining a predetermined distance.

4. The optical connector module as claimed in claim 1, wherein the first connector module comprises: a light emitting unit comprising first electrical terminals for electrically connecting to the first device, light emitting devices for emitting light beams according to the electrical signals input by the first electrical terminals, and a driving portion for driving the light emitting devices; and a first connector for connecting the light emitting unit and the optical fiber cable so that the light emitting unit and the optical fiber cable can be aligned with each other while maintaining a predetermined distance; and wherein the second connector module comprises: a light receiving unit comprising light receiving devices for receiving the optical information signals transmitted through the optical fiber cable and converting the optical information signals into converted electrical signals, and second electrical terminals, for electrically connecting to the second device and transmitting the electrical information signals based on the converted electrical signals; and a second connector for connecting the light receiving unit and the optical fiber cable so that the light receiving unit and the optical fiber cable can be aligned to each other while maintaining a predetermined distance; and wherein the second device comprises an amplifier for amplifying the electrical information signals transmitted through the second electrical terminals.

5. The optical connector module as claimed in claim 1, wherein in order to enable electrical power supplied from the first device to be transmitted to the second connector module, the optical connector module further comprises: a first power transmitting portion installed in the first connector module for transmitting electrical power supplied from the first device to a power line, installed between the first and second connector modules, wherein a first end of the power line is connected to the first power transmitting portion; and a second power transmitting portion installed in the second connector module and connected to a second end of the power line, where the second power transmitting portion transmits the electrical power to the amplifier.

6. An optical connector module for connecting between a first device that outputs electrical information signals and a second device that receives optical information signals, comprising:

a first connector module for connecting to the first device, for being electrically detachable, and for converting the electrical information signals from the first device into the optical information signals;

an optical fiber cable having a first end disposed to face the first connector module, for transmitting the optical information signals to a second end; and a second connector module installed at the second end of the optical fiber cable for guiding the connection of the optical fiber cable to the second device;

wherein the first connector module includes:

a light emitting unit comprising electrical terminals for electrically connecting to the first device and inputting the electrical information signals, light emitting devices for emitting light beams according to the electrical information signals, and a driving portion for driving the light emitting devices; and a first connector for connecting the light emitting unit and the optical fiber cable so that the light emitting unit and the optical fiber cable are aligned to each other while maintaining a predetermined distance, and guiding connection of the optical fiber cable to the first device; and wherein the light emitting unit further comprises a multiplexer provided between the electrical terminals and the driving portion for selecting one electrical signal among the electrical information signals according to a selection control signal, and wherein the second device comprises a demultiplexer corresponding to the multiplexer.

7. The optical connector module as claimed in claim 6 wherein the light emitting unit further comprises an encoder for encoding the one electrical signal and outputting encoded information, and wherein the second device further comprises a decoder corresponding to the encoder.

8. The optical connector module as claimed in claim 6, wherein the first device comprises a driving portion; and wherein the first connector module includes:

a light emitting unit comprising electrical terminals for electrically connecting to the first device and inputting the electrical information signals, and light emitting devices for emitting light beams according to the electrical information signals; and a first connector for connecting the light emitting unit and the optical fiber cable so that the light emitting unit and the optical fiber cable are aligned to each other while maintaining a predetermined distance; and wherein the driving portion drives the light emitting devices via the electrical terminals.

9. An optical connector module for connecting between a first device that outputs optical information signals and a second device having a port for receiving electrical information signals, comprising:

a first connector module;

an optical fiber cable, a first end of which is coupled to the first connector module for transmitting the optical information signals to a second end of the optical fiber cable, wherein the first connector module couples the optical fiber cable to the first device; and a second connector module for being connected to the second device while being electrically detachable and for converting the optical information signals transmitted through the optical fiber cable into the electrical information signals and supplying the electrical information signals to the second device;

wherein the second connector module includes:

a light receiving unit comprising light receiving devices for receiving the optical information signals transmitted through the optical fiber cable and outputting corresponding information signals, an amplifier for outputting amplified signals based on the information signals, and electrical terminals, electrically connected to the second device, for transmitting the electrical information signals in accordance with the amplified signals; and a second connector for connecting the light receiving unit and the optical fiber cable so that the light receiving unit and the optical fiber cable can be aligned to each other while maintaining a predetermined distance; and wherein the light receiving unit further comprises a demultiplexer provided between the amplifier and the electrical terminals, wherein the first device comprises a multiplexer corresponding to the demultiplexer and where the multiplexer selects one electrical information signal among the electrical information signals according to a selection control signal.

10. The optical connector module as claimed in claim 9, wherein the first device further comprises an encoder for encoding information signals input into the first device and the light receiving unit further comprises a decoder for decoding signals corresponding to the information signals encoded by the encoder.

11. The optical connector module as claimed in claim 9, wherein the second connector module includes: a light receiving unit comprising light receiving devices for receiving the optical information signals transmitted through the optical fiber cable and outputting corresponding information signals, and electrical terminals, electrically connected to the second device, for transmitting the electrical information signals in accordance with the information signals output by the light receiving devices; and a second connector for connecting the light receiving unit and the optical fiber cable so that the light receiving unit and the optical fiber cable can be aligned to each other while maintaining a predetermined distance;

wherein the second device comprises an amplifier for outputting amplified signals corresponding to the electrical information signals transmitted through the electrical terminals.

12. The optical connector module as claimed in claim 9, wherein in order to enable electrical power supplied from the first device to be transmitted to the second connector module, the optical connector module further comprises: a first power transmitting portion, installed in the first device and the first connector module, for transmitting the electrical power supplied from the first device to a power line installed between the first and second connector modules, wherein a first end of the power line is connected to the first power transmitting portion; and a second power transmitting portion installed in the second connector module and connected to a second end of the power line, wherein the second power transmitting portion transmits the electrical power to the amplifier.

* * * * *